United States Patent
Chan et al.

(10) Patent No.: US 6,828,237 B1
(45) Date of Patent: Dec. 7, 2004

(54) SIDEWALL POLYMER DEPOSITION METHOD FOR FORMING A PATTERNED MICROELECTRONIC LAYER

(75) Inventors: Bor-Wen Chan, Hsinchu (TW);
Fang-Cheng Chen, Hsin-chu (TW);
Hsien-Kuang Chiu, Hsinchu (TW);
Yuan-Hung Chiu, Taipei (TW);
Han-Jan Tao, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/662,069

(22) Filed: Sep. 11, 2003

(51) Int. Cl.[7] ............................................. H01L 21/311
(52) U.S. Cl. ....................................... 438/695; 438/689
(58) Field of Search ............................... 438/695, 689, 438/696, 704, 706, 717, 725, 723, 724, 734, 735, 738, 743, 744, 745, 942, 954, 963

(56) References Cited

U.S. PATENT DOCUMENTS

| | | | | |
|---|---|---|---|---|
| 5,296,410 A | * | 3/1994 | Yang | 438/696 |
| 5,453,156 A | | 9/1995 | Cher et al. | |
| 5,902,133 A | * | 5/1999 | Linliu | 438/717 |
| 5,916,821 A | * | 6/1999 | Kerber | 438/737 |
| 6,110,837 A | * | 8/2000 | Linliu et al. | 438/723 |
| 6,391,788 B1 | | 5/2002 | Khan et al. | |

* cited by examiner

Primary Examiner—David Nhu
(74) Attorney, Agent, or Firm—Tung & Associates

(57) ABSTRACT

A plasma etch method for forming a patterned target layer within a microelectronic product forms an etch residue layer adjoining a patterned mask layer formed upon a blanket target layer. After removing the patterned mask layer, the etch residue layer is laterally increased to form a laterally increased etch residue layer. The laterally increased etch residue layer is employed as an etch mask for forming the patterned target layer from the blanket target layer. The method is particularly useful for forming gate electrodes within semiconductor products.

20 Claims, 1 Drawing Sheet

SIDEWALL POLYMER DEPOSITION METHOD FOR FORMING A PATTERNED MICROELECTRONIC LAYER

BACKGROUND OF THE INVENTION

1. Field of the Invention

The invention relates generally to methods for forming patterned microelectronic layers within microelectronic products. More particularly, the invention relates to methods for efficiently forming patterned microelectronic layers within microelectronic products.

2. Description of the Related Art

Microelectronic products are formed from substrates over which are formed microelectronic devices. The microelectronic devices in turn are interconnected with patterned conductor layers to form the microelectronic products.

As microelectronic product integration levels have increased and microelectronic device and patterned conductor layer dimensions have decreased, it has become increasingly more difficult to form patterned microelectronic layers with diminished dimensions and enhanced dimensional control.

The present invention is directed towards the foregoing object.

Various methods have been disclosed in the microelectronic product fabrication art for forming patterned layers.

Included but not limited among the methods are those disclosed within: (1) Cher et al., in U.S. Pat. No. 5,453,156 (a plasma etch method employing a fluorine containing etchant gas rather than a chlorine containing etchant gas for forming a patterned polysilicon layer); (2) Linliu et al., in U.S. Pat. No. 6,110,837 (a plasma etch method for forming a patterned hard mask layer of one-half critical dimension); and (3) Kahn et al., in U.S. Pat. No. 6,391,788 (a two-step plasma etch method for forming a patterned layer with enhanced etch efficiency).

The disclosures of each of the foregoing references are incorporated herein fully by reference.

Desirable are additional etch methods for forming patterned layers with diminished dimension and enhanced dimensional control.

The invention is directed towards the foregoing object.

SUMMARY OF THE INVENTION

A first object of the invention is to provide a method for forming a patterned layer within a microelectronic product.

A second object of the invention is to provide a method in accord with the first object of the invention, wherein the patterned layer is formed with diminished dimension and enhanced dimensional control.

In accord with the objects of the invention, the invention provides a method for forming a patterned layer within a microelectronic product.

The method first provides a substrate. A blanket target layer is formed over the substrate and a patterned mask layer is formed upon the blanket target layer. The method provides for vertically incompletely etching the blanket target layer while employing a plasma etch method and the patterned mask layer as an etch mask. The vertically incomplete etching provides an incompletely vertically etched blanket target layer and an etch residue layer upon a sidewall of the patterned mask layer. The method further provides for removing the patterned mask layer from the incompletely vertically etched blanket target layer. The method still further provides for further etching the incompletely vertically etched blanket target layer while employing the plasma etch method. The further etching provides a further etched incompletely vertically etched blanket target layer having formed thereupon a laterally increased etch residue layer. Finally, the method provides for further etching the further etched incompletely vertically etched blanket target layer while employing the plasma etch method and the laterally increased etch residue layer as an etch mask to form a patterned target layer.

Thus, the invention employs a single etch method sequentially: (1) with a patterned mask layer formed upon a blanket target layer to form an incompletely vertically etched blanket target layer and an etch residue layer adjoining the patterned mask layer; (2) without the patterned mask layer to form a laterally increased etch residue layer upon a further etched incompletely vertically etched blanket target layer; and (3) with the laterally increased residue layer as a mask to form a patterned target layer from the further etched incompletely vertically etched blanket target layer.

Within the invention, the patterned mask layer may be removed intrinsic to the single plasma etch method or independent of the single plasma etch method.

The invention provides a method for forming a patterned layer of diminished dimension and enhanced dimensional control within a microelectronic product.

The invention realizes the foregoing object within the context of a plasma etch method which provides an etch residue layer upon the sidewall of a patterned mask layer employed for etching a blanket target layer upon which is formed the patterned mask layer. Upon removal of the patterned mask layer, the plasma etch method forms a laterally increased etch residue layer from the etch residue layer. The laterally increased etch residue layer is employed as an etch mask for forming the patterned target layer from the blanket target layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a method for forming a patterned layer of diminished dimension and enhanced dimensional control within a microelectronic product.

The invention realizes the foregoing object within the context of a plasma etch method which provides an etch residue layer upon the sidewall of a patterned mask layer employed for etching a blanket target layer upon which is formed the patterned mask layer. Upon removal of the patterned mask layer, the plasma etch method forms a laterally increased etch residue layer from the etch residue layer. The laterally increased etch residue layer is employed as an etch mask for forming the patterned target layer from the blanket target layer.

FIG. 1 to FIG. 7 show a series of schematic cross-sectional diagrams illustrating the results of progressive stages of forming a patterned layer within a microelectronic product in accord with the preferred embodiment of the invention.

Figure 1:
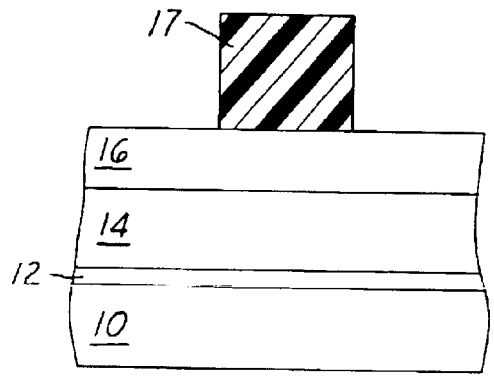
FIG. 1, FIG. 2, FIG. 3, FIG. 4, FIG. 5, FIG. 6 and FIG. 7 show a series of schematic cross-sectional diagrams illustrating the results of progressive stages of fabricating a patterned layer within a microelectronic product in accord with the present invention.

FIG. 1 shows a substrate 10. A blanket substrate layer 12 is formed upon the substrate 10. A blanket target layer 14 is formed upon the blanket substrate layer 12. A blanket first mask layer 16 is formed upon the blanket target layer 14. Finally, a patterned second mask layer 17 is formed upon the blanket first mask layer 16.

The substrate 10 may be employed within a microelectronic product selected from the group including but not limited to semiconductor products, ceramic substrate products and optoelectronic products. Thus, the substrate 10 may be formed of materials selected from the group including but not limited to conductor materials, semiconductor materials and dielectric materials. Preferably, the substrate 10 is a semiconductor substrate employed within a semiconductor product. The semiconductor substrate may be of either dopant polarity, several dopant concentrations and various crystallographic orientations, as are conventional when fabricating semiconductor products.

The blanket substrate layer 12 may also be conventional in the microelectronic product art, and the blanket substrate layer 12 may also be incorporated as a portion of the substrate 10. When the substrate 10 is a semiconductor substrate, the blanket substrate layer 12 is preferably a blanket gate dielectric layer, typically formed to a thickness of from about 5 to about 100 angstroms upon the semiconductor substrate.

The blanket target layer 14 may also be conventional in the microelectronic product fabrication art and may be formed of materials including but not limited to conductor materials, semiconductor materials and dielectric materials (i.e., a polysilicon material absent doping or with an appropriate level of doping would fulfill each of the foregoing three materials categories). When the substrate 10 is a semiconductor substrate and the blanket substrate layer 12 is a blanket gate dielectric layer, the blanket target layer 14 is preferably a blanket gate electrode material layer. The blanket gate electrode material layer is typically formed at least in part of a doped polysilicon material (having a dopant concentration of from about 1E13 to about 1E22 dopant atoms per cubic centimeter) formed to a thickness of from about 500 to about 3500 angstroms.

The blanket first mask layer 16 may be formed of mask materials as are conventional with respect to the materials from which are formed the blanket target layer 14. Typically, the blanket first mask layer 16 is formed of a hard mask material which may include, but is not limited to, conductor hard mask materials, semiconductor hard mask materials and dielectric hard mask materials. More typically, the blanket first mask layer 16 is formed of a dielectric hard mask material, such as a silicon nitride material, a silicon oxide material or a silicon oxynitride material. Typically, the blanket first mask layer 16 is formed to a thickness of from about 100 to about 1500 angstroms.

The patterned second mask layer 17 is typically a photoresist mask layer. The patterned second mask layer 17 is typically formed to a thickness of from about 1000 to about 5000 angstroms, and to a linewidth of from about 0.04 to about 0.13 microns.

Figure 2:
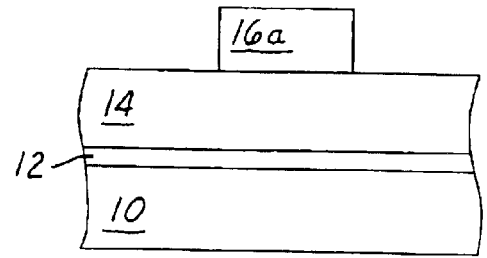

FIG. 2 shows the results of: (1) patterning the blanket first mask layer 16 to form a patterned first mask layer 16a while employing the patterned second mask layer 17 as an etch mask; and (2) stripping the patterned second mask layer 17 from the patterned first mask layer 16a.

The patterning of the blanket first mask layer 16 to form the patterned first mask layer 16a may be undertaken while employing etch methods as are conventional in the microelectronic product fabrication art. Typically, such etch methods are anisoptropic plasma etch methods which employ a fluorine containing etchant gas composition when the blanket first mask layer 16 is formed of a silicon containing dielectric material, such as silicon oxide, silicon nitride or silicon oxynitride.

The patterned second mask layer 17 may be stripped from the patterned first mask layer 16a while employing stripping methods as are also conventional in the microelectronic product fabrication art. Such stripping methods may include, but are not limited to wet chemical stripping methods and dry plasma stripping methods.

Figure 3:
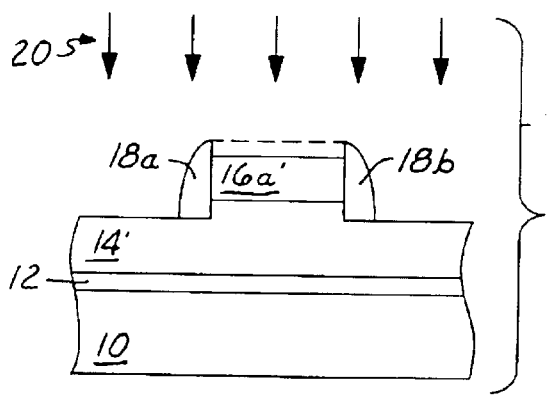

FIG. 3 shows the results of partially vertically etching the blanket target layer 14 with an etching plasma 20 to form a partially vertically etched blanket target layer 14' while employing the patterned first mask layer 16a as an etch mask. The partial vertical etching also partially vertically etches the patterned first mask layer 16a to form a partially vertically etched patterned first mask layer 16a'. Thus, within the preferred embodiment of the invention, the blanket first mask layer 16 and the blanket target layer 14 are formed of separate materials with comparable etch rates (i.e., within about +/−50 percent of each other) within the etching plasma 20. Such is not absolutely required within the invention. The blanket first mask layer 16 may alternatively be formed of a material having a substantially lower etch rate in the etching plasma 20 with respect to the blanket target layer 14.

FIG. 3 also shows a pair of etch residue layers 18a and 18b formed adjoining a pair of sidewalls of the partially vertically etched patterned first mask layer 16a'. The pair of etch residue layers 18a and 18b is generally a pair of polymer layers whose dimensions may be controlled incident to control of etch parameters within the etching plasma 20.

Under circumstances where the blanket target layer 14 is formed of a polysilicon material and the patterned first mask layer 16a is formed of a silicon oxide, silicon nitride or silicon oxynitride hard mask material, the etching plasma 20 may employ an etchant gas composition comprising a fluorine (i.e., fluorine, hydrogen fluoride, sulfur hexafluoride or nitrogen trifluoride) or fluorocarbon (i.e., C1 to C4 linear, branched and etchant gas, along with an oxygen containing etchant gas and an optional diluent gas. A flow rate of the oxygen containing etchant gas typically will determine a maximum bottom linewidth of the pair of etch residue layers 18a and 18b. The maximum bottom linewidth is preferably from about 0.09 to about 0.03 microns.

The etching plasma 20 typically also employs: (1) a reactor chamber pressure of from about 1 to about 100 mtorr; (2) a radio frequency source power of from about 100 to about 1000 watts and a radio frequency bias power of from about 10 to about 500 watts; (3) a substrate 10 (and overlying layers) temperature of from about 10 to about 150 degrees centigrade; (4) a sulfur hexafluoride flow rate of from about 10 to about 100 standard cubic centimeters per minute; (5) an oxygen flow rate of from about 1 to about 50 standard cubic centimeters per minute; and (6) a helium diluent flow rate of from about 5 to about 500 standard cubic centimeters per minute.

Figure 4:
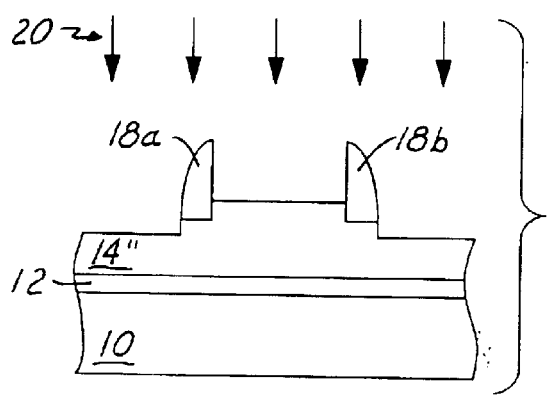

FIG. 4 shows the results of further etching the microelectronic product of FIG. 3 within the etching plasma 20. As illustrated in FIG. 4, the partially vertically etched blanket target layer 14' is further etched to form a further partially vertically etched blanket target layer 14". In addition, the partially vertically etched patterned first mask layer 16a' is completely etched and removed to leave exposed a central portion of the further partially vertically etched blanket target layer 14" interposed between the pair of etch residue layers 18a and 18b. Although FIG. 4 illustrates the further etching of the foregoing layers within the etching plasma 20, the invention is also operative under circumstances where the patterned first mask layer 16a or the partially vertically etched patterned first mask layer 16a' is removed independently of the etching plasma 20 such as to provide the pair of etch residue layers 18a and 18b separated by an uncovered plateau within the further partially vertically etched blanket target layer 14".

Figure 5:
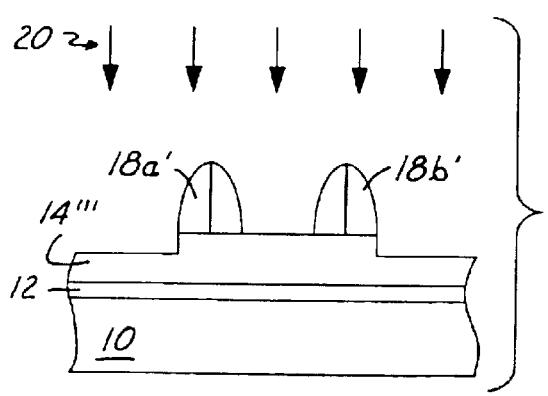

FIG. 5 shows the results of still further etching the further partially vertically etched blanket target layer 14" within the etching plasma 20 to form a still further partially vertically etched blanket target layer 14'". As is illustrated within FIG. 5, since the pair of etch residue layers 18a and 18b has nominally vertical facing sidewalls, the additional etching forms a pair of laterally increased etch residue layers 18a' and 18b' having an increased linewidth (typically from about 0.02 to about 0.06 microns each) in comparison with the pair of etch residue layers 18a and 18b (typically from about 0.01 to about 0.03 microns each). As illustrated in FIG. 5, the increase in linewidth accretes to the facing sidewall surfaces of the pair of etch residue layers 18a and 18b.

Figure 6:
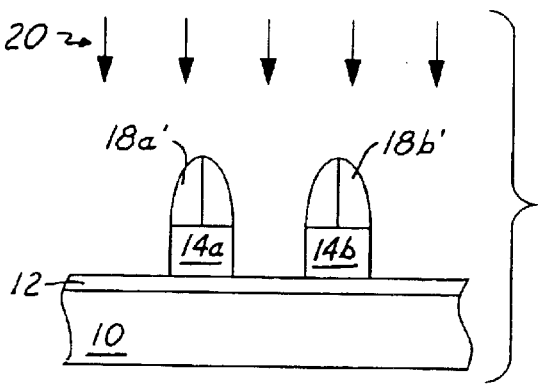

FIG. 6 shows the results of completely etching the still further partially vertically etched blanket target layer 14'" within the etching plasma 20 to form a pair of patterned target layers 14a and 14b while employing the pair of laterally increased etch residue layers 18a' and 18b' as a pair of etch mask layers. Within each of FIG. 3, FIG. 4, FIG. 5 and FIG. 6, the etching plasma 20 may be continuously operated without any change in etching parameters. Subsequent to the etching as illustrated in FIG. 6, an overetching with a plasma etchant highly specific for a material from which is formed the blanket target layer 14 with respect to a material from which is formed the blanket substrate layer 12 may be desirable. When the blanket target layer 14 is formed of a polysilicon material and the blanket substrate layer 12 is formed of a silicon oxide material, an overetching plasma comprising a chlorine or HBr containing etchant gas may be appropriate.

Figure 7:
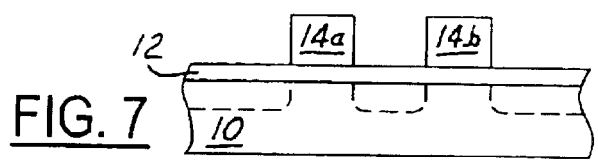

FIG. 7 shows the results of stripping the pair of laterally increased etch residue layers 18a' and 18b' from the pair of patterned target layers 14a and 14b. The pair of laterally increased etch residue layers 18a' and 18b' may be stripped employing stripping methods and materials which are selective with respect surrounding layers.

Finally, under circumstances where the substrate 10 is a semiconductor substrate, the blanket substrate layer 12 is a gate dielectric layer and the pair of patterned target layers 14a and 14b is a pair of gate electrodes, a series of source/drain regions may be implanted into the semiconductor substrate such as to provide a pair of field effect transistor devices. Such intended ion implanted regions are shown in phantom within FIG. 7.

FIG. 7 shows the results of forming a pair of patterned target layers with decreased dimension and enhanced dimensional control within a microelectronic product. The invention realizes the foregoing object by employing a pair of laterally increased etch residue layers as a pair of etch mask layers when forming the pair of patterned target layers. The invention preferably realizes the foregoing object while employing a single plasma etch method employing a single etching plasma, in conjunction with a patterned mask layer of etch properties generally nonselective within the single etching plasma with respect to a blanket target layer from which is formed the patterned target layers. The laterally increased etch residue layers are formed intrinsically in a self-aligned fashion, and originally upon a sidewall of the patterned mask layer but not covering a top surface of the patterned mask layer (i.e., the laterally increased etch residue layers are not formed incident to anisotropic etching of an independently formed blanket layer). The pair laterally increased etch residue layers (and the pair of patterned target layers formed incident to subsequent anisotropic etching while employing those layers as an etch mask) may be formed of linewidth less than a minimum photolithographically resolvable linewidth for forming the patterned mask layer.

The preferred embodiment of the invention is illustrative of the invention rather than limiting of the invention. Revisions and modifications may be made to methods, materials, structures and dimensions in accord with the preferred embodiment of the invention while still providing a method for forming a patterned layer in accord with the invention, further in accord with the accompanying claims.

What is claimed is:

1. A method for forming a patterned layer comprising:
   providing a substrate;
   forming over the substrate a blanket target layer;
   forming upon the blanket target layer a patterned mask layer;
   etching vertically incompletely the blanket target layer while employing a plasma etch method and the patterned mask layer as an etch mask to form an incompletely vertically etched blanket target layer and an etch residue layer upon a sidewall of the patterned mask layer;
   removing the patterned mask layer from the incompletely vertically etched blanket target layer;
   etching further the incompletely vertically etched blanket target layer while employing the plasma etch method to form a further etched incompletely vertically etched blanket target layer having formed thereupon a laterally increased etch residue layer; and
   etching further the further etched incompletely vertically etched blanket target layer while employing the plasma etch method and the laterally increased etch residue layer as an etch mask to form a patterned target layer.

2. The method of claim 1 wherein the substrate is employed within a microelectronic product selected from the group consisting of integrated circuit products, ceramic substrate products and optoelectronic products.

3. The method of claim 1 wherein the blanket target layer is formed of a material selected from the group consisting of conductor materials, semiconductor materials and dielectric materials.

4. The method of claim 1 wherein the etch residue layer and the laterally increased etch residue layer are formed of a fluoropolymer etch residue material.

5. The method of claim 1 wherein the patterned mask layer is removed employing the plasma etch method.

6. The method of claim 1 wherein the patterned mask layer is removed independent of the plasma etch method.

7. The method of claim 1 wherein:
   the patterned mask layer has a linewidth of from about 0.04 to 0.13 microns;

the etch residue layer has a linewidth of from about 0.01 to about 0.03 microns; and the laterally increased etch residue layer has a linewidth of from about 0.02 to about 0.06 microns.

8. The method of claim 1 wherein the etch residue layer is formed intrinsic to the plasma etch method.

9. A method for forming a gate electrode comprising:

providing a semiconductor substrate;

forming over the semiconductor substrate a blanket gate electrode material layer;

forming upon the blanket gate electrode material layer a patterned mask layer;

etching vertically incompletely the blanket gate electrode material layer while employing a plasma etch method and the patterned mask layer as an etch mask to form an incompletely vertically etched blanket gate electrode material layer and an etch residue layer upon a sidewall of the patterned mask layer;

removing the patterned mask layer from the incompletely vertically etched blanket gate electrode material layer;

etching further the incompletely vertically etched blanket gate electrode material layer while employing the plasma etch method to form a further etched incompletely vertically etched blanket gate electrode material layer having formed thereupon a laterally increased etch residue layer; and etching further the further etched incompletely vertically etched blanket gate electrode material layer while employing the plasma etch method and the laterally increased etch residue layer as an etch mask to form a gate electrode.

10. The method of claim 9 wherein the etch residue layer and the laterally increased etch residue layer are formed of a fluoropolymer etch residue material.

11. The method of claim 9 wherein the patterned mask layer is removed employing the plasma etch method.

12. The method of claim 9 wherein the patterned mask layer is removed independent of the plasma etch method.

13. The method of claim 9 wherein:

the patterned mask layer has a linewidth of from about 0.04 the etch residue layer has a linewidth of from about 0.01 to about 0.03 microns; and the laterally increased etch residue layer has a linewidth of from about 0.02 to about 0.06 microns.

14. The method of claim 9 wherein the etch residue layer is formed intrinsic to the plasma etch method.

15. A method for forming a gate electrode comprising:

providing a semiconductor substrate;

forming over the semiconductor substrate a blanket gate electrode material layer;

forming upon the blanket gate electrode material layer a patterned mask layer;

etching vertically incompletely the blanket gate electrode material layer while employing a fluorine and oxygen containing plasma etch method and the patterned mask layer as an etch mask to form an incompletely vertically etched blanket gate electrode material layer and an etch residue layer upon a sidewall of the patterned mask layer;

removing the patterned mask layer from the incompletely vertically etched blanket gate electrode material layer;

etching further the incompletely vertically etched blanket gate electrode material layer while employing the plasma etch method to form a further etched incompletely vertically etched blanket gate electrode material layer having formed thereupon a laterally increased etch residue layer; and etching further the further etched incompletely vertically etched blanket gate electrode material layer while employing the plasma etch method and the laterally increased etch residue layer as an etch mask to form a gate electrode.

16. The method of claim 15 wherein the etch residue layer and the laterally increased etch residue layer are formed of a fluoropolymer etch residue material.

17. The method of claim 15 wherein the patterned mask layer is removed employing the plasma etch method.

18. The method of claim 15 wherein the patterned mask layer is removed independent of the plasma etch method.

19. The method of claim 15 wherein:

the patterned mask layer has a linewidth of from about 0.04 to about 0.13 microns;

the etch residue layer has a linewidth of from about 0.01 to about 0.03 microns; and the laterally increased etch residue layer has a linewidth of from about 0.02 to about 0.06 microns.

20. The method of claim 15 wherein the etch residue layer is formed intrinsic to the plasma etch method.

* * * * *